(12) United States Patent  (10) Patent No.: US 9,407,220 B1
Deo                        (45) Date of Patent: Aug. 2, 2016

(54) DIGITALLY CONTROLLED VARIABLE TRANSDUCTANCE STAGE FOR MICROWAVE MIXERS AND AMPLIFIERS

(71) Applicant: ANALOG DEVICES, INC., Norwood, MA (US)

(72) Inventor: Sukhjinder S. Deo, Wilsonville, OR (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/663,761

(22) Filed: Mar. 20, 2015

(51) Int. Cl.
*H03F 3/45* (2006.01)
*H03F 5/00* (2006.01)
*H03G 3/30* (2006.01)
*H03F 1/02* (2006.01)
*H03F 3/193* (2006.01)

(52) U.S. Cl.
CPC .......... *H03F 3/45179* (2013.01); *H03F 1/0205* (2013.01); *H03F 3/193* (2013.01); *H03G 3/3036* (2013.01); *H03F 2200/451* (2013.01); *H03F 2203/45112* (2013.01)

(58) Field of Classification Search
None
See application file for complete search history.

(56) References Cited

U.S. PATENT DOCUMENTS

| 4,837,530 A | 6/1989 | Kondoh |
| 5,349,312 A | 9/1994 | Huettner et al. |
| 2012/0319755 A1 | 12/2012 | Zhang |

*Primary Examiner* — Patricia T Nguyen
(74) *Attorney, Agent, or Firm* — Patent Capital Group

(57) ABSTRACT

A transconductance stage has a common-emitter transconductance stage having common emitter transistors, a common-base transconductance stage having common base transistors, wherein collectors of the common emitter transistors and collectors of the common base transistors are cross-connected to allow in-phase signal combining, an input differential signal applied to the common-emitter transconductance stage and the common-base transconductance stage in parallel, and a selectable gain output, the output selectable between at least one high gain and one low gain, wherein the low gain is lower than the high gain. A switchable transconductance stage has at least one input voltage signal having a frequency in the microwave range, a switchable gain setting, the switchable gain setting having at least two gain settings, and an output current signal having a gain determined by the switchable gain setting.

20 Claims, 7 Drawing Sheets

DIGITALLY CONTROLLED VARIABLE TRANSDUCTANCE STAGE FOR MICROWAVE MIXERS AND AMPLIFIERS

BACKGROUND

Transconductance elements are crucial and ubiquitous in many circuit blocks and microwave circuits are no exception. Active Gilbert type mixer requires a transconductance stage, also commonly referred to as voltage-to-current converter stage or in short V2I stage. Taking the example of a down-converting mixer, the V2I stage converts the RF input signal, usually a voltage signal to the current signal, which is supplied to the emitter or source terminals of the mixer switching core transistors.

The linearity (usually characterized as IIP3) and noise (conveniently computed as Noise Figure or NF) performance of the overall mixer are often set by the V2I stage itself, because of this being in the RF signal path. In designing a V2I stage, these are typically conflicting requirements and one must be traded off for the other. From the overall mixer performance point of view, higher IIP3 is desired when input signal is large and lower NF is desired when input signal is small, while lower IIP3 is acceptable under this condition. One of the common approaches to achieve this is putting a variable attenuator in front of the transconductance (V2I) stage. The V2I stage is then designed for the best desired NF with moderate IIP3. The variable attenuation in front of the V2I is adjusted to improve the IIP3 at the expense of NF. For every dB of attenuation inserted, the IIP3 improves by a dB and NF of the attenuator plus V2I combination becomes worse by a dB. This is sometimes referred to as dB for dB relationship.

This scheme works well at moderate RF frequencies, but at Microwave frequencies highly linear variable attenuator block is extremely challenging to implement. Some prior art references in this area are— US20120319755A1, U.S. Pat. No. 4,837,530A, U.S. Pat. No. 5,349,312A.

At present most state of the art high performance variable attenuators at microwave frequencies, are fabricated on InGaAs/GaAs processes using pHEMT and/or MEM-ET devices. But this creates a challenge in integration of these attenuators with other radio functions which are being implemented on advanced SiGe BiCMOS processes. So it would be desirable to implement a variable microwave attenuator (or gain) function on a modern SiGe BiCMOS process.

SUMMARY

One embodiment is a transconductance stage with an input differential signal, a common-emitter transconductance stage having common emitter transistors, a common-base transconductance stage having common base transistors, wherein collectors of the common emitter transistors and collectors of the common base transistors are cross-connected, and a selectable gain output, the output selectable between at least one high gain and one low gain, wherein the low gain is lower than the high gain. Another embodiment is a switchable transconductance stage having at least one input voltage signal having a frequency in the microwave range, a switchable gain setting, the switchable gain setting having at least two gain settings, and an output current signal having a gain determined by the switchable gain setting.

DETAILED DESCRIPTION OF THE EMBODIMENTS

The embodiments of a transconductance stage discussed here may apply to the input to a microwave mixer design or may apply to an amplifier. Microwave frequencies, for the purposes of this discussion, range from 3 GHz to 30 GHz. The discussion will first address the significance of this circuit element from the mixer perspective and then apply the ideas to wider applications in amplifiers. In the context of the microwave mixer design, the embodiments here propose a new architecture for the transconductance (V2I) stage with a built-in variable gain, which can be digitally switched to transition from high gain (low NF) to low gain (high IIP3) state. The gain differences between the high gain and low gain settings can be chosen for a given design. A gain difference of 12 dB has been demonstrated up to 30 GHz. In the simplest implementation a single switch changes the gain from one state to the other. If in-between gain settings are desired, the architecture lends itself to allow multiple gain settings, imitating a built-in DGA function with a coarse gain step of 3 to 6 dB depending upon the implementation.

Although not an analog gain control function, such a gain step is sufficient in many applications, such as monitoring backchannel receivers for point-to-point microwave communication links.

The Noise Figure (NF) verses linearity (IIP3) trade-off for this V2I stage is similar to that of an attenuator placed in front of a high gain (low NF) V2I. The high gain setting results in the best NF and lower IIP3, while the low gain setting increases the NF by the gain change amount, while improving the IIP3 by the same dB amount. The main advantages over the arrangement of the VVA followed by a high gain V2I stage include, inherently wideband implementation, no need for inter-stage matching, both the VVA and V2I functions in one block achieving inherent integration of the VVA function, savings in die area used, and better overall Noise Figure, by virtue of avoiding the insertion loss of the VVA, which is typically in the range of 2 dB and often frequency dependent.

Figure 1:
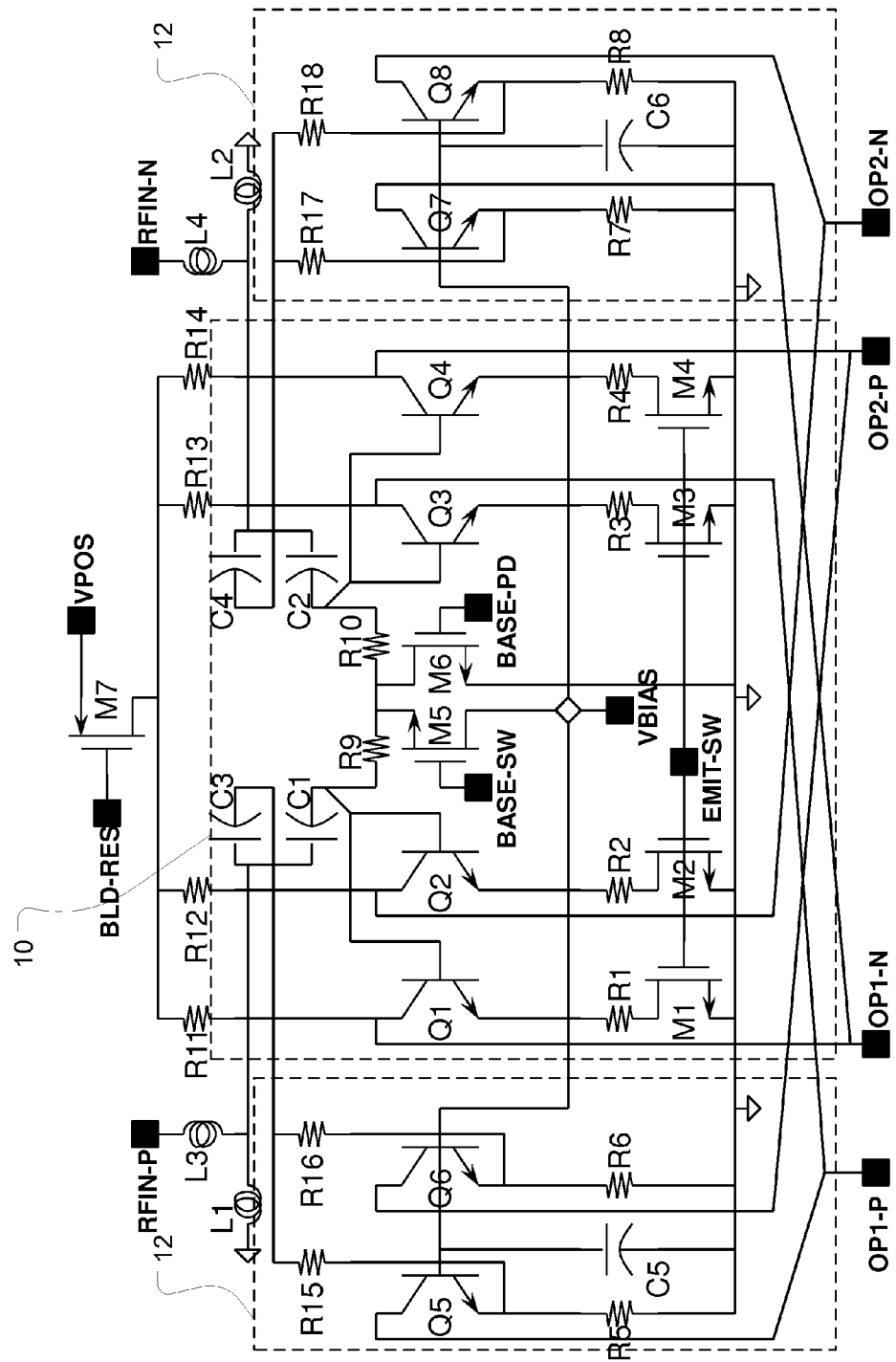
FIG. 1 shows an embodiment of a transconductance stage.

As shown in FIG. 1, one embodiment employs a degenerated common-emitter (CE) transconductance stage 10 comprising of Q1-Q4, R1-R4 and M1-M4 with common-base (CB) transconductance stage 12 comprising of Q5-Q8, R5-R8 and R15-R18. Since the CE and CB output AC currents are 180° out of phase, the collectors of the CE and CB transistors are cross-connected with respect to the input differential signal, so that the output currents of CE and CB stages are added in-phase. The degenerated CE stage is biased for maximum desired RF transconductance or maximum gain, hence the best desired NF, while the input resistors R15-R18 of the CB stage, which set its transconductance, are chosen to set the minimum desired RF transconductance or minimum gain and also the best case IIP3. For the maximum gain setting, both the degenerated CE and CB stages are ON, while for the minimum gain setting, CE stage is turned OFF and the CB stage stays ON. Typically, CE stage has higher transconductance than the CB stage. Taking the 12 dB gain step as an example, CB stage contributes one-fourth of the total transconductance, so that when CE stage is switched off, the total transconductance goes down to $¼^{th}$ of the total or down by 12 dB.

The switching details and the effect of this switching arrangement on the input impedance under these two extreme gain states are described in the next paragraphs. If multiple gain settings are implemented, the CB stage stays ON for all the gain settings, while the CE stage is split into multiple parallel sections, and hence can be partially turned OFF.

In implementing the RF switch to turn ON/OFF the CE transconductance stage, the most important criteria is that the MOS switches should not compromise the linearity of the V2I stage. Ideally, the MOS transistors should be avoided in the direct signal path, owing to their inherent signal dependent non-linearity, particularly at microwave frequencies. The next best alternative is to use the MOS switches at a node, where they experience close to zero signal swing across them in the ON state. The CE stage lends itself to good RF switching, because the MOS switches can be placed in series with the degeneration resistors near the ground terminal. In the embodiment of FIG. 1, the MOS switches M1-M4, are placed near the ground terminal. These are also augmented by the base pull down switch devices M5-M6.

When the CE stage is ON, the ground switches M1-M4 are turned ON providing a low impedance connection from the degeneration resistors to the RF ground. The signal swing across these devices is very small, thus the effect on IIP3 is negligible. The base bias MOS switch M5 is turned ON, providing the appropriate base bias voltage and the base pull-down MOS switch M6 is turned OFF. One should note that the base switching controls the DC bias only and is not in the RF path. The base bias resistors R9-R10 isolate the MOS switches from the signal path. In this manner, the parasitics effects of the MOS transistors controlling the base do not affect the IIP3.

Figure 5:
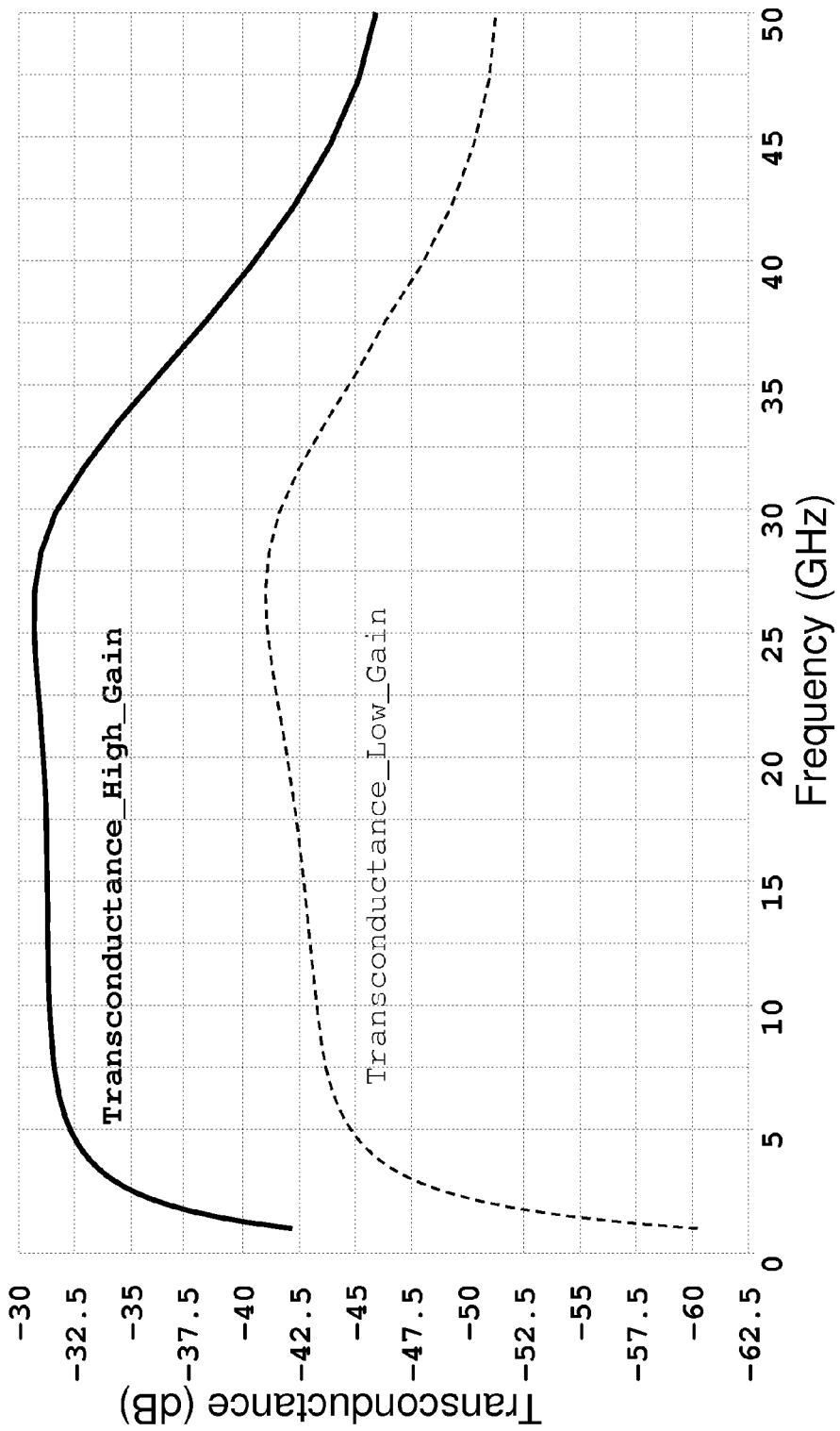
FIG. 5 shows a graph of transconductance versus frequency.
Figure 6:
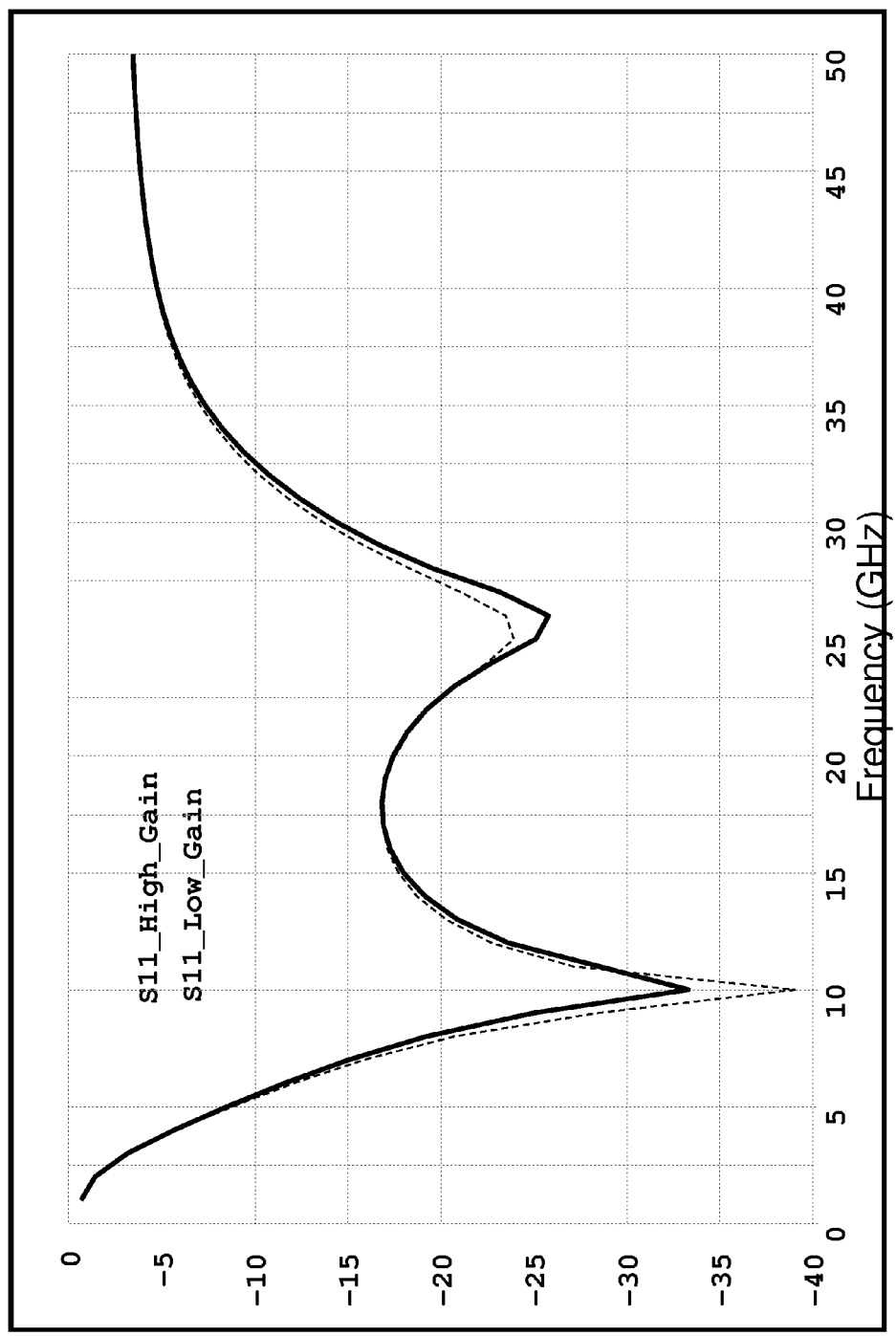
FIG. 6 shows a graph of input return loss versus frequency.

When the CE stage is OFF, the ground switches M1-M4 are turned OFF, thus opening up the emitter connections. Simultaneously, the base bias is turned OFF via M5 and the base pull-down switch M6 is turned ON. The CE transistors only remain connected at the high impedance collector terminal to the common-base (CB) stage collectors. The parasitic capacitances of the CE devices at the RF input (base) and output (collector) terminals, change very little between the ON and OFF states in this arrangement, allowing robust input matching options and maintain the signal bandwidth through the V2I stage independent of the V2I gain setting. FIG. 5 shows the simulated transconductance and FIG. 6 shows the input return loss v/s frequency corresponding to the two gain settings. Separate RF coupling capacitors C1-C2 for the CE stage and C3-C4 for the CB stage allow pulling the base of the CE devices to ground in the CE OFF stage.

The CB stage comprised of Q5-Q8, R5-R8 and R15-R18 contributes primarily to the real part of the input impedance and it is set by the transconductance setting input series resistor R15-R18 as shown in FIG. 1. Having the CB stage stay ON for all the gain settings stabilizes the input impedance of the overall V2I stage. The real part of the input impedance of the degenerated CE stage comprising of Q1-Q4, R1-R4 and M1-M4, is relatively high, but its capacitive part is significant, which should be compensated for by the input match.

By choosing 100 ohm value for the CB stage input resistors R15-R18, which is effectively 50 ohm looking into each of the RFIN-P and RFIN-N terminals, a low frequency input match of the RF stage is automatically achieved. This also allows wideband input match to be achieved easily by tuning out the capacitive part of the input impedance, with shunt inductors L1-L2. An important feature of this combining mechanism is that input impedance is not much affected by whether the CE stage is ON or OFF. CE stage mostly contributes the capacitive part to the input impedance, which changes minimally by switching it ON and OFF. The bandwidth of such a combined CE/CB stages is ultimately limited by the input match. The value of the shunt inductors L1-L2 decides the low frequency corner, while the self-resonance of these inductors contributes mainly to the high frequency corner. A second series inductance of smaller value on each input L3-L4 is used to improve the input return loss around the self-resonance frequency of the shunt inductors L1-L2. As shown in FIGS. 5 and 6, for one set of match components, RF bandwidth of 5-30 GHz has been achieved.

As discussed above, 50 ohm single-ended or 100 ohm differential is a convenient input impedance for the CB stage, which allows easy input matching options. But, since the resistors that set the input impedance, R15-R18, also sets the transconductance under the minimum gain setting, it may be desirable to change their value to adjust the minimum gain as well as IIP3. Within a certain range these resistors can be adjusted up or down without having much effect on the input return loss, because it's dominated by the capacitive part of the overall structure, particularly at high frequencies. A simple resistive attenuator can also be placed in place of the series resistors, to couple less RF signal into the common base stage. Such an attenuator will be wideband and have negligible effect on the input impedance.

The CB and CE output currents are 180° out of phase if the inputs to the two stages are in-phase voltage signals. In order to combine the output currents in-phase, one approach is to cross-connect the outputs of the CB and CE stages with regard to the input differential signal RFIN-P and RFIN-N. FIG. 1 shows one embodiment. The limitation of such a cross-connection at the collector terminals is that it complicates the wiring inter-connect layout. This gets further complicated, when the V2I stage is used for a double-balanced mixer, requiring two sets of output currents to feed the in-phase (I) and quadrature-phase (Q) channels of the mixer core. These two outputs are shown in FIG. 1 as (OP1-P, OP1-N) and (OP2-P, OP2-N) pairs.

These collector nodes are the most parasitic sensitive nodes in this structure, because relatively high impedance needs to be maintained until the emitter/source of the switching core devices. Secondly, careful attention needs to be given to the symmetry of different wiring segments, so that no phase errors are introduced leading up to the mixer core. Minimizing the wiring line lengths from the collector terminals of the transistors up to the mixer core is crucial to maintain the high frequency performance of the V2I stage. The present embodiments show two alternate ways of combining the CB and CE stages for better high frequency performance as examples with the understanding that they may be extended.

One should note that currents corresponding to I and Q channels of the mixer need to have positive and negative signal lines physically together for each channel. In the V2I embodiment of FIG. 2, the input signals to the CB and CE stages are cross-connected with regard to the differential input signal to introduce 180° phase shift. This simplifies the output wiring layout considerably as just one collector cross-over of the CE devices Q2 and Q3 is needed. This helps to extend the bandwidth.

Figure 3:
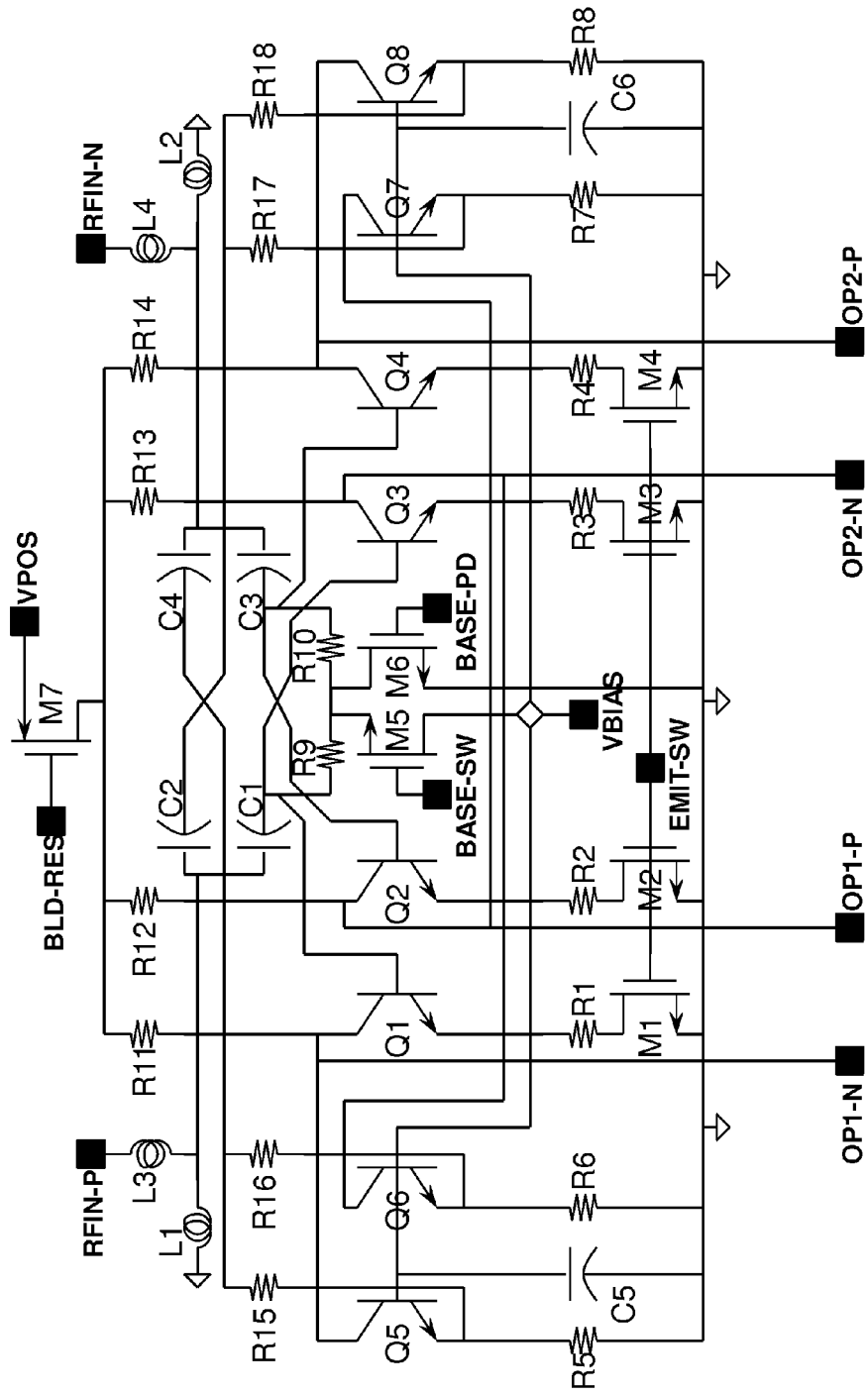
FIG. 3 shows an alternative embodiment of a transconductance stage.

FIG. 3 shows another wiring improvement to further simplify the output inter-connect layout. In FIG. 3, the crossing over is done entirely on the input side, such that device pairs Q1-Q2 and Q3-Q4 receive input signals of opposite polarity and their outputs can be directly wired to the mixer core as a differential signal for the two channels. This avoids crossing over at the output and simplifies critical output wiring and improves the frequencies response of the V2I stage.

The DC current in the proposed V2I stage changes significantly between the high gain and the low gain settings, as the CE stage is turned ON and OFF respectively. The current could change by a factor 3 or more. Such a large variation in current typically cannot be handled by the mixer core, because the mixer core devices' size needs to be optimized for best RF performance. The current density through the mixer core devices must be maintained about the same in both the high gain and low gain settings.

Figure 2:
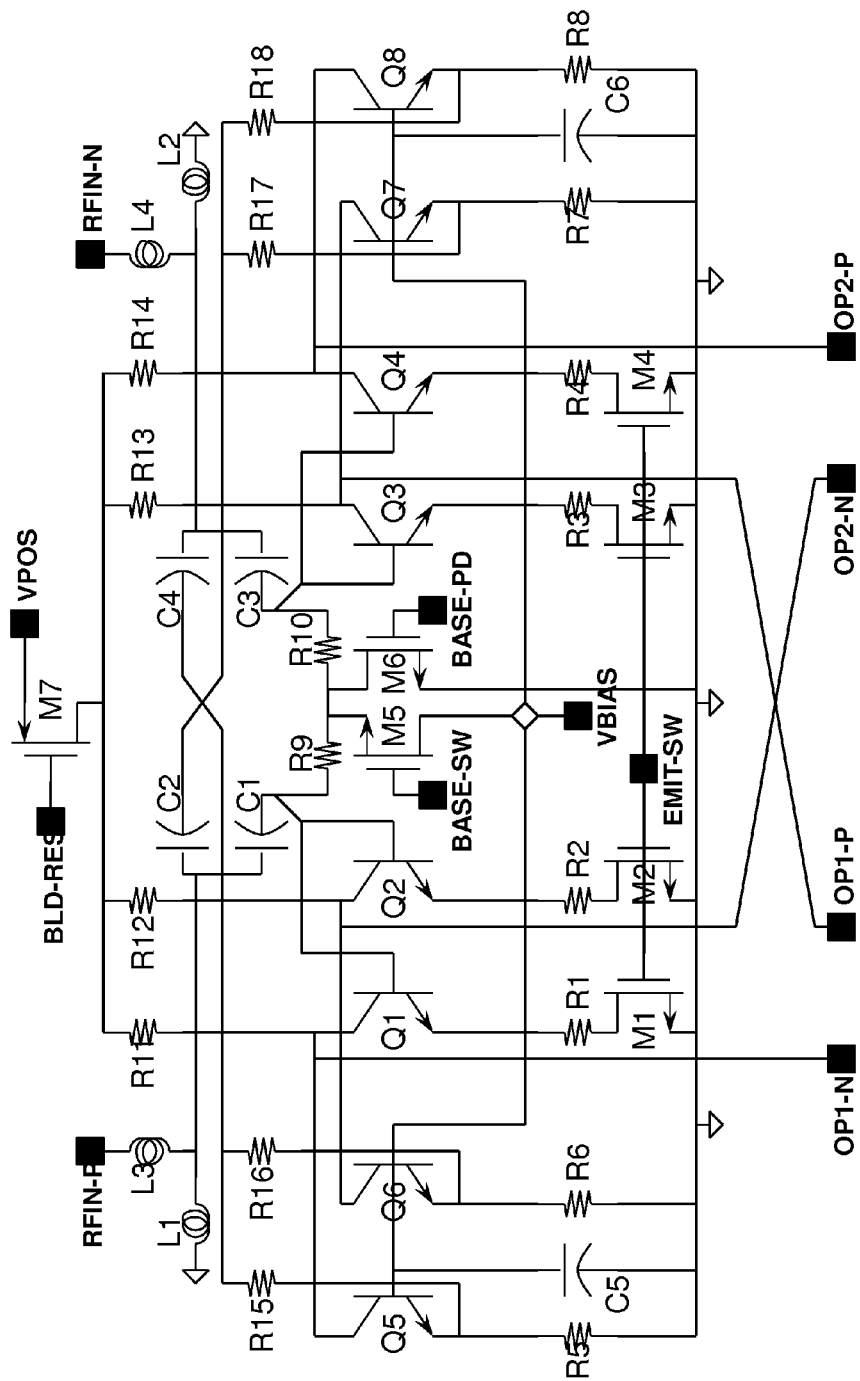
FIG. 2 shows an alternative embodiment of a transconductance stage.

This problem is solved by providing a parallel DC path for the current, in the high gain state, when CE stage is ON. As shown in FIGS. 1 to 3, the shunt resistors, R11-R14, sometimes called the bleed resistors are connected at each of the collector output nodes of the V2I stage. The other terminal of these resistors is connected to the positive supply through a switching device M7. This switching device could be a PMOS or PNP transistor and is turned ON whenever the CE stage is ON. The value of the resistors is selected such that, they shunt all of the additional DC current from the CE stage, so that mixer core runs at the CB stage current for all the gain settings. These bleed resistors have some effect on the RF performance of the V2I stage for a couple of reasons:

These are connected on the parasitic sensitive collector nodes. So any wiring associated with these resistors affects performance. This invention proposes a layout arrangement to minimize this wiring impact, where by the bleed resistors are physically placed on the input side of the V2I stage, in between the matching inductors. These resistors can thus be placed close to the transistors and the connections to these from the collector terminals are short. Moreover the resistors do not interfere with or further lengthen the signal output connections to the mixer, which are on the output side of the V2I.

The value of bleed resistors, R11-14, is determined by the current they need to carry and the voltage drop across them. Typically they are not large enough compared with the impedance looking into the emitter/source terminals of the switching core devices, resulting in some RF signal loss in them. This reduces the gain in the high gain state, when maximum gain is desired. If a higher supply voltage is feasible, this would allow bigger resistor values, which will reduce this impact on gain.

Despite these shortcomings, the resistors are necessary to stabilize the mixer performance, and offer a better choice at microwave frequencies compared with an active style P-type current source, which will introduce much higher parasitics capacitance at this node.

Up to this point, the discussion has focused on mixers. The discussion now turns to the architecture of an input-VGA (variable gain amplifier) based on the above outlined V2I structure. The term "input-VGA" is used to imply that the gain is varied on the input of amplifier and hence constant output noise and IIP3 is expected as the gain is changed. The VGA is constructed from the above explained mixer architecture, by replacing the mixer core devices with a set of cascode devices. The output load can be inductive or partially inductive, depending upon the bandwidth requirements.

Figure 4:
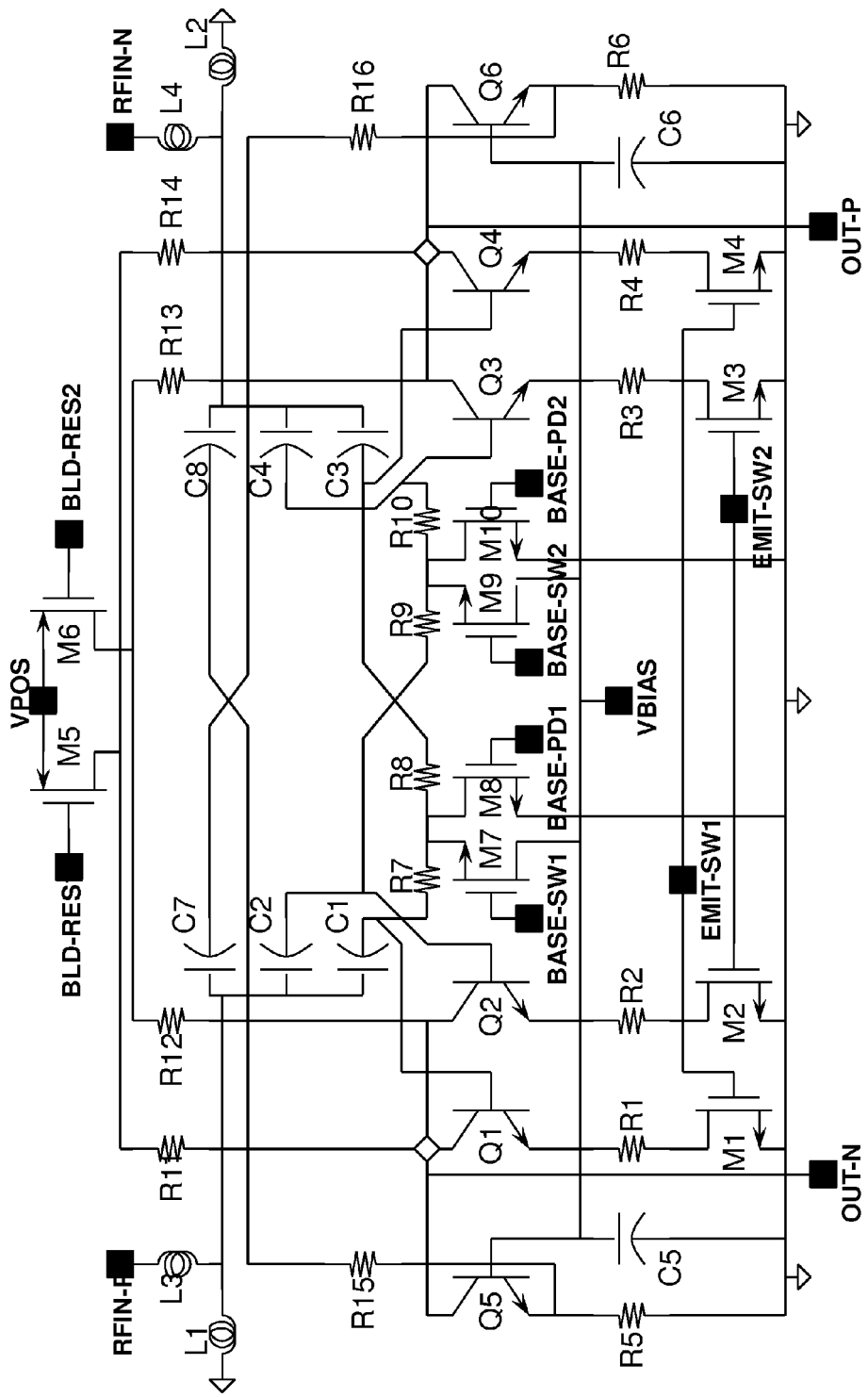
FIG. 4 shows an embodiment of a transconductance stage for an amplifier.

As opposed to the mixer case where two sets of output currents from the V2I stage are required for the I and Q channels, only one set of outputs is required for the amplifier. This simplifies the transconductance stage layout and results in the bandwidth improvement. Single or multiple gain steps can be implemented by splitting up the CE stage in parallel paths, which can be separately turned ON or OFF by the FET switches, in the same fashion as explained above. FIG. 4 shows the detailed connections for a 3 gain step V2I stage, using one pair of CB devices consisting of Q5-Q6, R5-R6 and R15-R16 and two sets of parallel CE devices consisting of Q1-Q4, R1-R4 and M1-M4, controlled by two sets of biasing devices consisting of R7-R10 and M7-M10. This results in 12 dB total gain step with a 6 dB intermediate gain step for the Variable Gain Amplifier. The bandwidth is limited by the input match, as outlined in the above sections.

Figure 7:
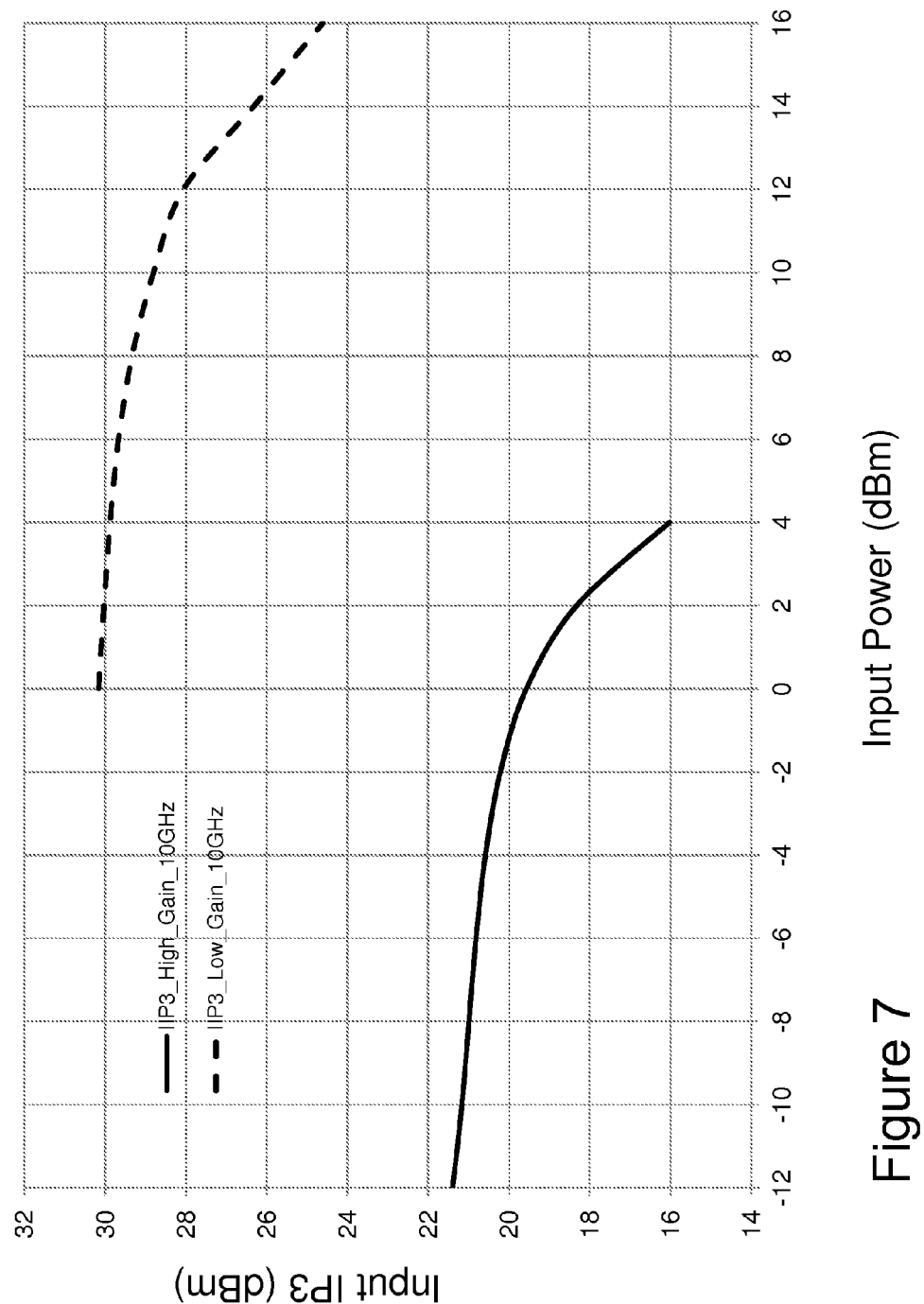
FIG. 7 shows a graph of IIP3 versus input power.

As mentioned previously, FIG. 5 shows a graph of transconductance in dB versus frequency in GHz of the embodiments shown here. FIG. 6 shows a graph of the input return loss in dB versus frequency in GHz. FIG. 7 shows the IIP3 (linearity) performance of input in dBm versus input power in dBm.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. A transconductance circuit operable at microwave frequencies, comprising:
   positive and negative input terminals;
   positive and negative output terminals;
   a first common base transistor coupled between the positive input terminal and the positive output terminal;
   a second common base transistor coupled between the negative input terminal and the negative output terminal;
   a first common emitter circuit including a first common emitter transistor coupled between the positive input terminal and the negative output terminal; and
   a second common emitter circuit including a second common emitter transistor coupled between the negative input terminal and the positive output terminal.

2. The transconductance circuit of claim 1, wherein:
   the first common emitter circuit includes a first switch coupled between an emitter of the first common emitter transistor and ground; and
   the second common emitter circuit includes a second switch coupled between an emitter of the second common emitter transistor and ground.

3. The transconductance circuit of claim 1, wherein:
   the first common emitter circuit includes a third common emitter transistor and a third switch, wherein the third switch is coupled between an emitter of the third common emitter transistor and ground;
   the second common emitter circuit includes a fourth common emitter transistor and a fourth switch, wherein the fourth switch is coupled between an emitter of the third common emitter transistor and ground.

4. The transconductance circuit of claim 3, wherein the first and second switches are coupled to a first control input to actuate the first and second switches simultaneously, and wherein the third and fourth switches are coupled to a second control input to actuate the third and fourth switches simultaneously.

5. The transconductance circuit of claim 1, further comprising:

a first degeneration resistor between the first common emitter transistor and ground; and a second degeneration resistor between the second common emitter transistor and ground.

6. The transconductance circuit of claim 5, wherein the first and second degeneration resistors are in series with first and second switches, respectively.

7. The transconductance circuit of claim 1, further comprising:

a base bias switch coupled between a bias voltage node and a base node;

wherein the base node is coupled to a base of the first common base transistor and a base of the second common base transistor.

8. The transconductance circuit of claim 7, further comprising:

a base pull down switch coupled between ground and the base node; and control circuitry to close the base bias switch when the base pull down switch is open, and vice versa.

9. The transconductance circuit of claim 1, wherein a first electrical pathway on a substrate between the first common emitter transistor and the negative output terminal crosses over a second electrical pathway on the substrate between the second common emitter transistor and the positive output terminal.

10. The transconductance circuit of claim 1, wherein a first electrical pathway between the positive input terminal and the first common base transistor crosses over a second electrical pathway between the negative input terminal and the second common base transistor.

11. The transconductance circuit of claim 1, wherein:

the positive and negative output terminals are first positive and negative output terminals;

the transconductance circuit further comprises second positive and negative output terminals;

the first common emitter circuit includes a third common emitter transistor coupled between the positive input terminal and the second negative output terminal; and the second common emitter circuit includes a fourth common emitter transistor coupled between the negative input terminal and the second positive output terminal.

12. The transconductance circuit of claim 11, wherein:

the first common emitter circuit includes a first switch coupled between an emitter of the first common emitter transistor and ground, and a third switch coupled between an emitter of the third common emitter transistor and ground; and the second common emitter circuit includes a second switch coupled between an emitter of the second common emitter transistor and ground, and a fourth switch coupled between an emitter of the fourth common emitter transistor and ground.

13. The transconductance circuit of claim 11, wherein no electrical pathway on a substrate between the first common emitter transistor and the first negative output terminal crosses over an electrical pathway on the substrate between the second common emitter transistor and the first positive output terminal.

14. The transconductance circuit of claim 1, further comprising:

a first shunt resistor coupled between the first common emitter transistor and a reference voltage; and a second shunt resistor coupled between the second common emitter transistor and the reference voltage.

15. An electronic device, comprising:
a transconductance circuit, including:
positive and negative input terminals,
positive and negative output terminals,
a first common base stage coupled between the positive input terminal and the positive output terminal,
a second common base stage coupled between the negative input terminal and the negative output terminal,
a first common emitter stage coupled between the positive input terminal and the negative output terminal, and
a second common emitter stage coupled between the negative input terminal and the positive output terminal; and
a mixer core or a cascode core coupled to the positive and negative output terminals.

16. The electronic device of claim 15, wherein:
the positive and negative output terminals are first positive and negative output terminals;
the transconductance circuit further comprises second positive and negative output terminals;
the first common emitter stage is coupled between the positive input terminal and the second negative output terminal;
the second common emitter stage is coupled between the negative input terminal and the second positive output terminal; and
a mixer core is coupled to the first positive and negative output terminals, and to the second positive and negative output terminals.

17. The electronic device of claim 15, wherein the electronic device is a variable gain amplifier and a cascode core is coupled to the positive and negative output terminals.

18. A method of performing voltage-to-current conversion, comprising:

receiving a control signal;

in response to receipt of the control signal, coupling a common emitter transistor stage into a transconductance circuit that includes a common base transistor stage;

receiving a microwave differential voltage signal; and generating microwave differential current signal by providing the microwave differential voltage signal to the common base transistor stage and the common emitter transistor stage.

19. The method of claim 18, wherein:

the common emitter transistor stage includes a first common emitter transistor coupled between a positive input terminal and a negative output terminal;

the common emitter transistor stage includes a second common emitter transistor coupled between a negative input terminal and a positive output terminal;

the microwave differential voltage signal includes a positive input signal received at the positive input terminal and a negative input signal received at the negative input terminal; and the microwave differential current signal includes a positive output signal generated at the positive output terminal and a negative output signal generated at the negative output terminal.

20. The method of claim 18, wherein the control signal is a first control signal, the common emitter transistor stage is a first common emitter transistor stage, and the method further includes:

receiving a second control signal; and in response to receipt of the second control signal, coupling a second common emitter transistor stage into the transconductance circuit that includes a common base transistor stage and the first common emitter transistor stage;

wherein generating microwave differential current signal includes providing the microwave differential voltage signal to the common base transistor stage, the first common emitter transistor stage, and the second common emitter transistor stage.

* * * * *